US006617750B2

(12) United States Patent
Dummermuth et al.

(10) Patent No.: US 6,617,750 B2
(45) Date of Patent: Sep. 9, 2003

(54) MICROELECTRICALMECHANICAL SYSTEM (MEMS) ELECTRICAL ISOLATOR WITH REDUCED SENSITIVITY TO INERTIAL NOISE

(75) Inventors: Ernst H. Dummermuth, Chesterland, OH (US); Richard D. Harris, Solon, OH (US); Michael J. Knieser, Richmond Heights, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/805,410

(22) Filed: Mar. 13, 2001

(65) Prior Publication Data

US 2001/0050618 A1 Dec. 13, 2001

Related U.S. Application Data

(63) Continuation-in-part of application No. 09/406,364, filed on Sep. 28, 1999, now Pat. No. 6,188,322, and a continuation-in-part of application No. 09/406,654, filed on Sep. 27, 1999, now Pat. No. 6,463,339, and a continuation-in-part of application No. 09/400,125, filed on Sep. 21, 1999, now Pat. No. 6,417,743.

(51) Int. Cl.[7] ................................................. H02N 1/00
(52) U.S. Cl. ........................................................ 310/309
(58) Field of Search .......................... 310/309; 340/664, 340/657

(56) References Cited

U.S. PATENT DOCUMENTS

| | | | |
|---|---|---|---|
| 5,578,976 A | 11/1996 | Yao | 333/262 |
| 5,761,350 A | 6/1998 | Koh | 385/14 |
| 5,783,340 A | 7/1998 | Farino et al. | 430/22 |
| 5,804,314 A | 9/1998 | Field et al. | 428/402 |
| 5,834,864 A * | 11/1998 | Hesterman et al. | 310/40 MM |
| 5,903,380 A | 5/1999 | Motamedi et al. | 359/224 |
| 5,955,932 A * | 9/1999 | Nguyen et al. | 333/186 |
| 5,959,516 A | 9/1999 | Chang et al. | 334/14 |
| 5,995,688 A | 11/1999 | Aksyuk et al. | 385/14 |
| 6,046,066 A | 4/2000 | Fang et al. | 438/52 |
| 6,071,426 A | 6/2000 | Lee et al. | 216/24 |
| 6,094,102 A | 7/2000 | Chang et al. | 331/17 |
| 6,100,477 A | 8/2000 | Randall et al. | 200/181 |
| 6,114,794 A | 9/2000 | Dhuler et al. | 310/307 |
| 6,127,767 A * | 10/2000 | Lee et al. | 310/309 |
| 6,137,206 A | 10/2000 | Hill | 310/206 |
| 6,159,385 A | 12/2000 | Yao et al. | 216/33 |
| 6,188,322 B1 * | 2/2001 | Yao et al. | 340/664 |
| 6,232,841 B1 | 5/2001 | Bartlett et al. | 330/305 |
| 6,232,847 B1 | 5/2001 | Marcy, V et al. | 331/167 |
| 6,236,281 B1 * | 5/2001 | Nguyen et al. | 331/154 |
| 6,348,788 B1 | 2/2002 | Yao et al. | 324/99 R |
| 6,417,743 B1 * | 7/2002 | Mihailovich et al. | 333/24 C |
| 6,463,339 B1 * | 10/2002 | Vasko | 700/18 |
| 6,497,141 B1 * | 12/2002 | Turner et al. | 73/105 |

OTHER PUBLICATIONS

Toumazou, C. et al., n–step Charge Injection Cancellation Scheme for Very Accurate Switched Current Circuits, Electronic Letters, V.30 (9) 680–681: 1994, Mar. 1994.

Emmerich, H., et al., A Novel Micromachined Magnetic–Field Sensor, MEMS 99 IEEE Conference, Jan. 17–21, 1999, IEEE Catalog No. 99ch36291c.

(List continued on next page.)

Primary Examiner—Thomas M. Dougherty
(74) Attorney, Agent, or Firm—Quarles & Brady; Alexander M. Gerasimow; William R. Walbrun

(57) ABSTRACT

Microelectricalmechanical systems (MEMS) manufactured on a microscopic scale using integrated circuit techniques may be used to measure a variety of parameters using electrical signals generated by the movement of small beams. Inertial noise may be canceled by the duplication of the beam structure for sensing of the acceleration to be subtracted from a similar beam structure used to measure the parameter of interest.

16 Claims, 7 Drawing Sheets

OTHER PUBLICATIONS

Madou, Marc, Fundamentals of Microfabrication, Chapters 2–4, CRC Press LLC, Boca Raton, FL: Dec. 1997.

Kovacs, Gregory T.A., Micromachined Transducers Sourcebook, Table of Contents, pp. 77–119 and Index, WCB McGraw–Hill, U.S.A.: Dec. 1998.

Teegarden, Darrell et al., How to Model and Stimulate Microgyroscope Systems, IEEE Spectrum, 65–75, Jul. 1998.

Emmerich, Harald et al., Magnetic Field Measurements with a Novel Surface Micromachined Magnetic–Field Sensor, IEEE Transactions on Electron Devices, V. 47 (5) 972–977, May 2000.

McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.

Miyajima, Hiroshi et al., High–Aspect Photolithography for MEMS Applications, J. of Microelectromechanical Sys., V.4(4) 220–229, Dec. 1995.

Lu, Crist et al., A Monolithic Surface Micromachined Accelerometer with Digital Output, IEEE J. of Solid State Circuits, V. 30 (12) 1367–1373, Dec. 1995.

Chen, Ming–Jer et al., Weak Inversion Charge Injection in Analog MOS Switches, IEEE J. of Solid–State Circuits, V. 30 (5) 604–606, May 1995.

Lemkin, Mark A. et al., A Fully Differential Lateral S? Accelerometer with Drift Cancellation Circuitry, SolidState Sensor and Actuator Workshop, Hilton Head, South Carolina, Jun. 2–6, 1996, pp. 90–93.

Boser, Bernhard E. et al., Surface Micromachined Accelerometers, IEEE J. of Solid–State Circuits, V. 31 (3) 366–375, Mar. 1996.

Fedder, Gary K. et al., Multimode Digital Control of a Suspended Polysilicon Microstructure, J. of Microelectromechanical Sys., V. 5 (4) 283–297, Dec. 1996.

Noriega, Gerardo, Sigma–Delta A/D Converters–Audio and Medium Bandwidths, Technical Notes–DT3 from RMS Instruments website: www.msinst.com, 6 pages, Feb. 1996.

Internet page: Decimator Filter DLL, NeuroDimension Inc.: www.nd.com, May 31, 2001.

U.S. patent application No.: 09/406,654, filed on Sep. 27, 1999. Now USP 6463339.

U.S. patent application No.: 09/400,125, filed on Sep. 21, 1999. Now USP 6417743.

U.S. patent application No.: 09/406,509, filed on Sep. 28, 1999. Now USP 6348788.

U.S. patent application No.: 09/955,493, filed on Sep. 18, 2001. Publication 20020084564.

U.S. patent application No.: 09/955,494, filed on Sep. 18, 2001. Now USP 6466005.

U.S. patent application No.: 09/675,861, filed Sep. 29, 2000. Now USP 6411214.

* cited by examiner

MICROELECTRICALMECHANICAL SYSTEM (MEMS) ELECTRICAL ISOLATOR WITH REDUCED SENSITIVITY TO INERTIAL NOISE

CROSS-REFERENCE TO RELATED APPLICATIONS

This application is a continuation in part of U.S. patent applications Ser. No. 09/406,364 filed Sep. 28, 1999 now U.S. Pat. No. 6,188,322; Ser. No. 09/406,654 filed Sep. 27, 1999, now U.S. Pat. No. 6,463,339 and Ser. No. 09/400,125 filed Sep. 21, 1999 now U.S. Pat. No. 6,417,743.

FIELD OF THE INVENTION

The present invention relates to electrical isolators and in particular to a microelectromechanical system (MEMS) device providing electrical isolation in the transmission of electrical signals while limiting motion-induced noise.

BACKGROUND OF THE INVENTION

Electrical isolators are used to provide electrical isolation between circuit elements for the purposes of voltage level shifting, electrical noise reduction, and high voltage and current protection.

Circuit elements may be considered electrically isolated if there is no path in which a direct current (DC) can flow between them. Isolation of this kind can be obtained by capacitive or inductive coupling. In capacitive coupling, an electrical input signal is applied to one plate of a capacitor to transmit an electrostatic signal across an insulating dielectric to a second plate at which an output signal is developed. In inductive coupling, an electrical input signal is applied to a first coil to transmit an electromagnetic field across an insulating gap to a second coil, which generates the isolated output signal. Both such isolators essentially block steady state or DC electrical signals.

Such isolators, although simple, block the communication of signals that have significant low frequency components. Further, these isolators can introduce significant frequency dependent attenuation and phase distortion in the transmitted signal. These features make such isolators unsuitable for many types of signals including many types of high-speed digital communications.

In addition, it is sometimes desirable to provide high voltage (>2 kV) isolation between two different portions of a system, while maintaining a communication path between these two portions. This is often true in industrial control applications where it is desirable to isolate the sensor/actuator portions from the control portions of the overall system. It is also applicable to medical instrumentation systems, where it is desirable to isolate the patient from the voltages and currents within the instrumentation.

The isolation of digital signals is frequently provided by optical isolators. In an optical isolator, an input signal drives a light source, typically a light emitting diode (LED) positioned to transmit its light to a photodiode or phototransistor through an insulating but transparent separator. Such a system will readily transmit a binary signal of arbitrary frequency without the distortion and attenuation introduced by capacitors and inductors. The optical isolator further provides an inherent signal limiting in the output through saturation of the light receiver, and signal thresholding in the input, by virtue of the intrinsic LED forward bias voltage.

Nevertheless, optical isolators have some disadvantages. They require a relatively expensive gallium arsenide (GaAs) substrate that is incompatible with other types of integrated circuitry and thus optical isolators often require separate packaging and assembly from the circuits they are protecting. The characteristics of the LED and photodetector can be difficult to control during fabrication, increasing the costs if unit-to-unit variation cannot be tolerated. The power requirements of the LED may require signal conditioning of the input signal before an optical isolator can be used, imposing yet an additional cost. While the forward bias voltage of the LED provides an inherent noise thresholding, the threshold generally cannot be adjusted but is fixed by chemical properties of the LED materials. Accordingly, if different thresholds are required, additional signal conditioning may be needed. Finally, the LED is a diode and thus limits the input signal to a single polarity unless multiple LEDs are used.

It is common to process analog electrical signals using digital circuitry such as microprocessors. In such situations, the analog signal may be periodically sampled and the samples converted into digital words input by an analog-to-digital converter (A/D) to and processed by the digital circuitry. Conversely, digital words produced by the digital circuitry may be converted into an analog signal through the use of a digital-to-analog converter (D/A) to provide a series of analog electrical values that may be filtered into a continuous analog signal. Isolation of such signals at the interface to the digital circuitry is often desired and may be performed by placing an optical isolator in series with the electrical signal representing each bit of the relevant digital word after the A/D converter and before the D/A converter. Particularly in the area of industrial controls where many isolated analog signals must be processed and output, a large number of optical isolators are required rendering the isolation very costly or impractical.

BRIEF SUMMARY OF THE INVENTION

The present invention provides a mechanical isolator manufactured using MEMS techniques and suitable for transmitting analog or digital signals. The isolator uses a specially fabricated microscopic beam supported on a substrate and whose ends are insulated from each other. One end of the beam is connected to a microscopic actuator, which receives a user input signal to move the beam based on that signal. The other end of the beam is attached to a sensor detecting movement of the beam to provide a corresponding value.

Acceleration of the substrate, which might move the beam in the absence of a user signal, is compensated for by fabricating a second identical beam that measures inertial force and removes it from the signal. This technique can be used generally not just with isolators but also with any MEMS device in which forces or movement caused by acceleration of the substrate must be canceled. In addition, this approach also applies to other common mode noise sources other than acceleration or inertia; such as: temperature, pressure, etc.

Specifically then, the present invention provides a microelectromechanical system (MEMS) with reduced inertial sensitivity. The invention includes a substrate and a first element supported from the substrate for movement relative to the substrate with respect to an axis. A first actuator is attached to the first element to exert a force thereupon dependent upon a parameter to be measured and urging the element toward a second position. The device also includes a second element supported from the substrate also for movement with respect to the axis. A sensor assembly communicates with the first and second elements to detect movement of the first and second elements and to provide an output subtracting their movements so as to be less sensitive to substrate acceleration or other common mode noise.

Thus it is one object of the invention to provide a MEMS sensor with reduced sensitivity to acceleration interfering with measurement of the desired parameter. The small size of the MEMS device allows two matched elements to be fabricated in close proximity to each other so as to be identical and to experience the same inertial forces so that one may provide an inertial reference signal that can be used to cancel the inertial contribution to the parameter measurement.

The second element may not have an input signal applied or an actuator or functioning actuator so as to detect only inertial forces or it may include a functional actuator which exerts a force upon the second element dependent upon the parameter to be measured but urging the second element in the opposite direction as the first element.

Thus it is another object of the invention to permit a simple cancellation, which reduces inertial noise, or a more sophisticated cancellation that reduces inertial noise while also boosting the desired signal.

The parameter may be an electrical signal and the second and first actuators may receive the input electrical signal related to the parameter and exert a force dependent on the input electrical signal. In this case, the device may include an inverting circuit receiving the parameter electrical signal and producing an inverted electrical signal for the second actuator.

Thus it is another object of the invention to permit the inertial noise cancellation with identical MEMS structures simply by inverting an electrical signal to one MEMS structure so that it operates in the opposite direction.

The MEMS device may include a second actuator attached to the second element but not communicating with the parameter to be measured and thus not exerting a force thereupon dependent upon the parameter to be measured.

Thus it is another object of the invention to provide for virtually identical MEMS structures, including actuators, so as to be equally sensitive to inertial noise.

The foregoing objects and advantages may not apply to all embodiments of the inventions and are not intended to define the scope of the invention for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

DETAILED DESCRIPTION OF THE INVENTION

Figure 1:
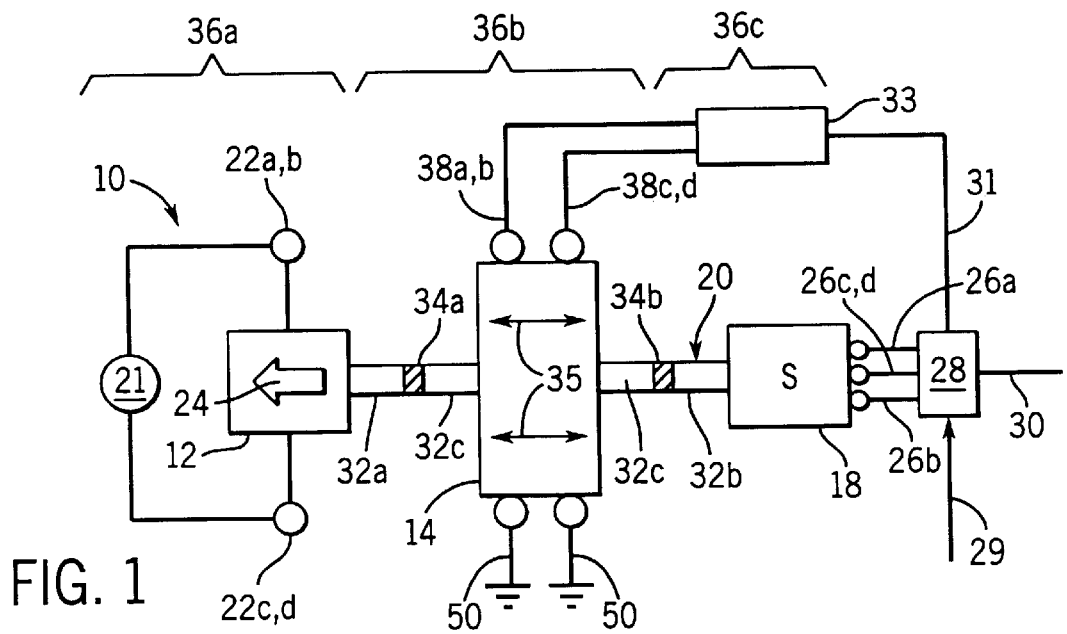
FIG. 1 is a simplified block diagram of the present analog isolator showing its elements of an actuator, a control structure and a sensor communicating along a single mechanical element that may move to transmit data between the actuator and sensor and showing insulating portions of the moving element.

Referring now to FIG. 1, a MEMS analog isolator 10 per the present invention includes an actuator 12, control element 14, and a sensor 18 mechanically interconnected by a movable beam 20.

The actuator 12 includes terminals 22a and 22b and 22c+22d through which an analog electrical input signal 21 may be received and converted into a mechanical force tending to move the beam 20 in an actuation direction 24 indicated by an arrow. In the microscopic scale of the MEMS analog isolator 10, the actuator may be a piezoelectric actuator, a thermal-expansion motor, a mechanical-displacement motor, an electrostatic motor, or a Lorenz-force motor generally known in the art, the latter two to be described in more detail below. For a Lorenz-force motor or thermal-expansion motor, the analog electrical input signal 21 will be a current, for the piezoelectric or electrostatic motor, the input electrical signal will be a voltage.

The actuator 12 communicates with a first end of the beam 20. An opposite end of the beam 20 is received by the sensor 18 which detects movement of the beam 20 and through its terminals 26a and 26b and 26c+26d produces an electrical signal that may be measured directly or further processed by processing electronics 28 to produce the output signal 30 indicating movement of the beam 20. The sensor 18 may be a piezoelectric-type sensor, a photoelectric sensor, a resistive sensor, an optical switching sensor, or a capacitive sensor according to techniques known in the art of MEMS design. In the preferred embodiment, the sensor 18 uses counterpoised movable plate capacitors as will be described in more detail below.

Attached to the beam 20 between the actuator 12 and the sensor 18 is the control element 14 which provides both a force on the beam 20 opposite the actuation direction 24 and tending to resist the operation of the actuator 12 or with the actuation direction 24 augmenting the operation of the actuator 12, as indicated by double headed arrows 35.

Absent an analog electrical input signal 21, the control element 14 may hold the beam 20 in a position toward the sensor 18. Ideally, the control element 14 provides a force that increases with motion of the beam 20 in the actuation direction 24. In this way, a simple relationship between actuation force and movement of the beam 20 is generated (e.g., with a simple spring-type system). The MEMS analog isolator 10 provides extremely low friction and inertia so this movement or force is consistent and rapid. Alternatively, the control element 14 may provide a rapidly increasing force (in a feedback system) arresting the movement of the beam 20 for any actuation force. Here the magnitude of the arresting force provides the output signal.

As described, the force provided by the control element 14 may be adjustable by varying a current or voltage to the structure and used in a feedback mode to essentially eliminate all but a small movement of the beam 20. Some movement of the beam 20 is necessary for the sensor 18 to provide the necessary countervailing feedback, but the movement may be reduced to an extent that non-linearities in the actuators and mechanical elements of the MEMS analog isolator 10, that might occur with more pronounced movement, are eliminated. Specifically, in this mode, the movement of the beam 20 is detected by processing electronics 28 to produce a position signal. The position signal is compared against a reference signal 29 to produce an error signal 31 which is directed to the control element to produce a restoring force returning the beam 20 to the null point. The connection between the error signal to the control element 14 may be direct or may be further modified by a feedback network 33 providing compensation for the system according to well-known feedback techniques. The feedback network 33 may steer voltage to either terminals 38c and 38d with a return at terminal 50 for actuation toward the sensor 18 or to terminals 38a and 38b with a return at terminal 50 for actuation toward the actuator 12 reflecting the fact that the electrostatic motors provide only a single direction of force.

The beam 20 includes conductive portions 32a and 32b, located at the actuator 12 and sensor 18, respectively, and such as may form part of the actuator 12 or sensor 18. Insulating portions 34a and 34b separate conductive portions 32a and 32b from a centermost conductive portion 32c that may be part of the control element 14; the insulating portions 34a and 34b thus defining three regions of isolation 36a–c. The first region 36a includes the actuator 12 and conductive portion 32a, the second region 36b includes the center conductive portion 32c and the control element 14, and the third region 36c includes the conductive portion 32b and sensor 18.

The insulated beam 20 provides a mechanism by which the analog electrical input signal 21 acting through the actuator 12 may produce a corresponding output signal 30 at the sensor 18 electrically isolated from the analog electrical input signal 21. The control element 14 may be electrically isolated from either the input signal and/or the output signal 30.

The control element 14 is preferably a Lorenz-force motor or an electrostatic motor of a type that will be described below. For the former of these two control elements, terminals 38a and 38b and return 50 are provided to provide a bi-directional current dictating the countervailing force provided by the control element 14. The direction of the current dictates the direction of the force. For the latter electrostatic structure, terminals 38a, 38b, 38c, and 38d are provided. Voltage is applied either to terminal pair 38a and 38b (with reference to return 50) or to terminal pair 38c and 38d (with respect to return 50) to determine the direction of the force.

Figure 2:
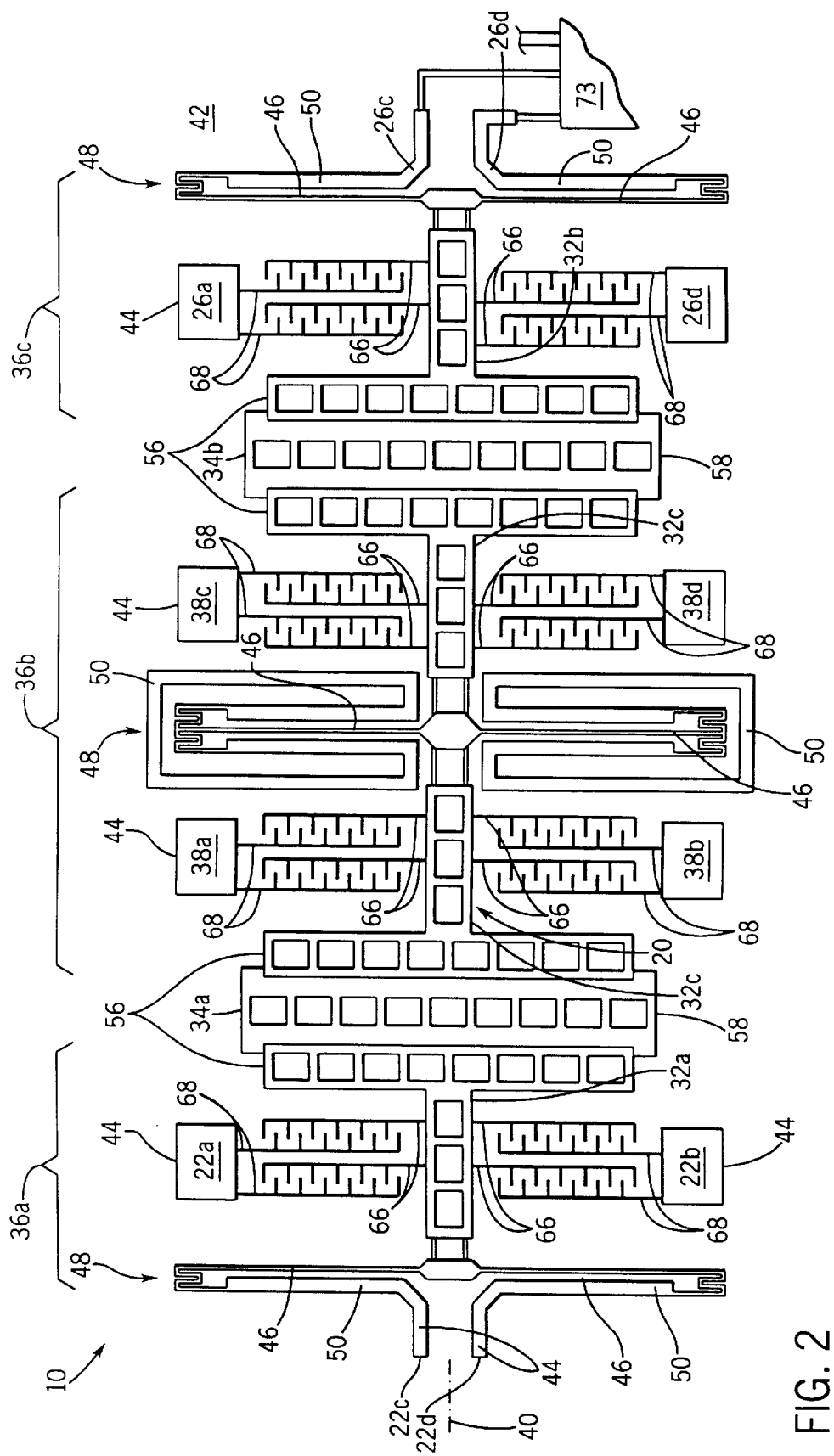
FIG. 2 is a top plan view of one embodiment of the isolator of FIG. 1 using three electrostatic motors and a capacitive sensor showing support of a moving beam connecting these components by means of flexible transverse arms and showing implementation of the insulating sections of the beam.

Referring now to FIG. 2, the beam 20 may extend above a substrate 42 along a longitudinal axis 40 passing along a midline between transversely opposed pylons 44 attached to a substrate 42. The pylons form the terminals 22a and 22b, 38a–38d, 26a, and 26b described above. Ideally, the substrate 42 is an insulating substrate and thus pylons 44 are all mutually isolated and particular conductive layers are placed or wire bonding used to make the necessary connections.

The beam 20 is supported away from the substrate 42 and held for movement along the longitudinal axis 40 by means of flexing arm pairs 46 extending transversely on opposite sides of both ends of the beam 20 and its middle. The flexing arms 46 extend away from the beam 20 to elbows 48 transversely removed from the beam 20 on each side of the beam 20. The elbows 48 in turn connect to expansion compensators 50, which return to be attached to the substrate 42 at a point near the beam 20. As mentioned above, these expansion compensators are not absolutely required. They serve as stress relief if that is needed. The flexing transverse arms 46 are generally parallel to the expansion compensators 50 to which they are connected. The flexing transverse arms 46, elbows 48 and expansion compensators are conductive to provide electrical connections between the conductive portions 32a, 32b and 32c and stationary electrical terminals (not shown).

Figure 4:
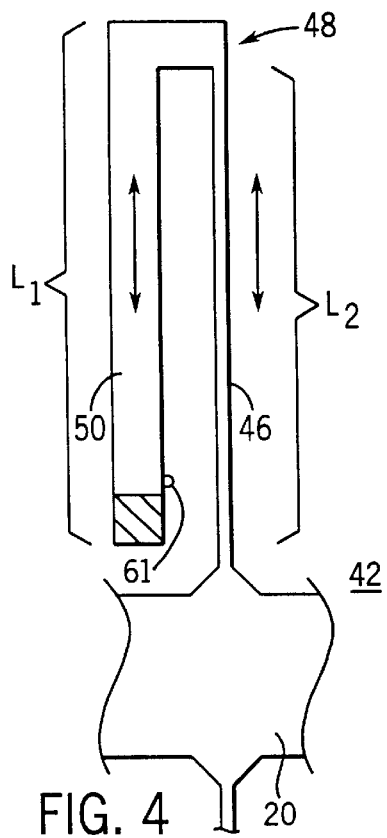
FIG. 4 is a fragmentary view of one transverse arm of FIG. 2 showing a doubling back of the arm at an elbow so as to provide stress relief.

Referring now to FIG. 4, the length $L_1$ of each expansion compensator 50 between its point of attachment 52 to the substrate 42 and its connection to a corresponding flexing transverse arm 46 at elbow 48 and the length $L_2$ of the flexing transverse arm 46 defined as the distance between its connection to beam 20 and the elbow 48 are set to be nearly equal so that expansion caused by thermal effects in the flexing transverse arm 46 is nearly or completely canceled by expansion in the expansion compensator 50. In this way, little tension or compression develops in the flexing transverse arm 46. Both the flexing transverse arm 46 and the expansion compensator 50 in this embodiment are fabricated of the same material, however it will be understood that different materials may also be used and lengths $L_1$ and $L_2$ adjusted to reflect the differences in thermal expansion coefficients. Note that a doubling back of the arm is not required. A straight connection will also work. The doubling back of the arm is a stress-relieving feature. Stress in the beam will affect the spring constant. Depending on the spring constant desired, and other geometric and process (e.g. substrate choice) considerations, stress relief may or may not be needed or desirable.

Figure 5A:
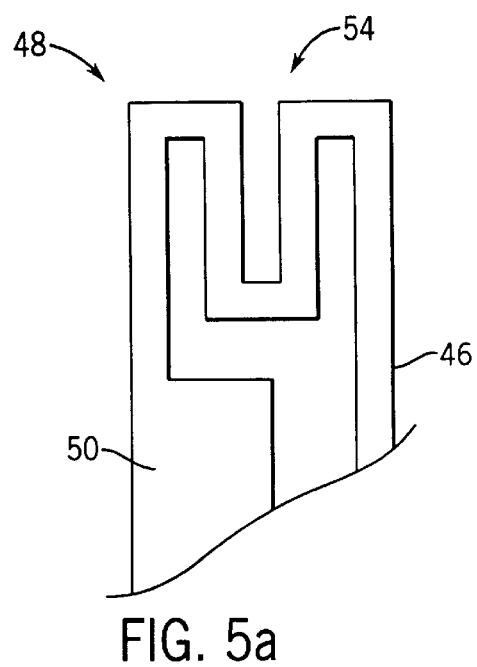
FIGS. 5a and 5b are fragmentary detailed views of the elbow of FIG. 4 showing the incorporation of a spring allowing angulation of the portion of the transverse arm attached to the beam for improved force characteristics.
Figure 5B:
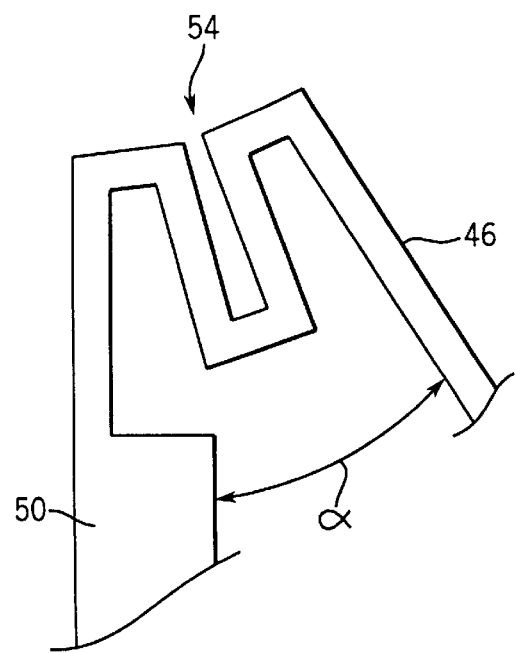

Referring to FIG. 5a, the elbow 48 may include a serpentine portion 54 extending longitudinally from the expansion compensator 50 to its flexing transverse arm 46. As shown in FIG. 5b, the serpentine portion 54 allow angulation a between the flexing transverse arm 46 and expansion compensator 50 such as provides essentially a radius adjusting pivot, both decreasing the force exerted by the flexing transverse arm pairs 46 on the beam 20 with movement of the beam 20 and decreasing the stiffness of the structure.

Figure 3:
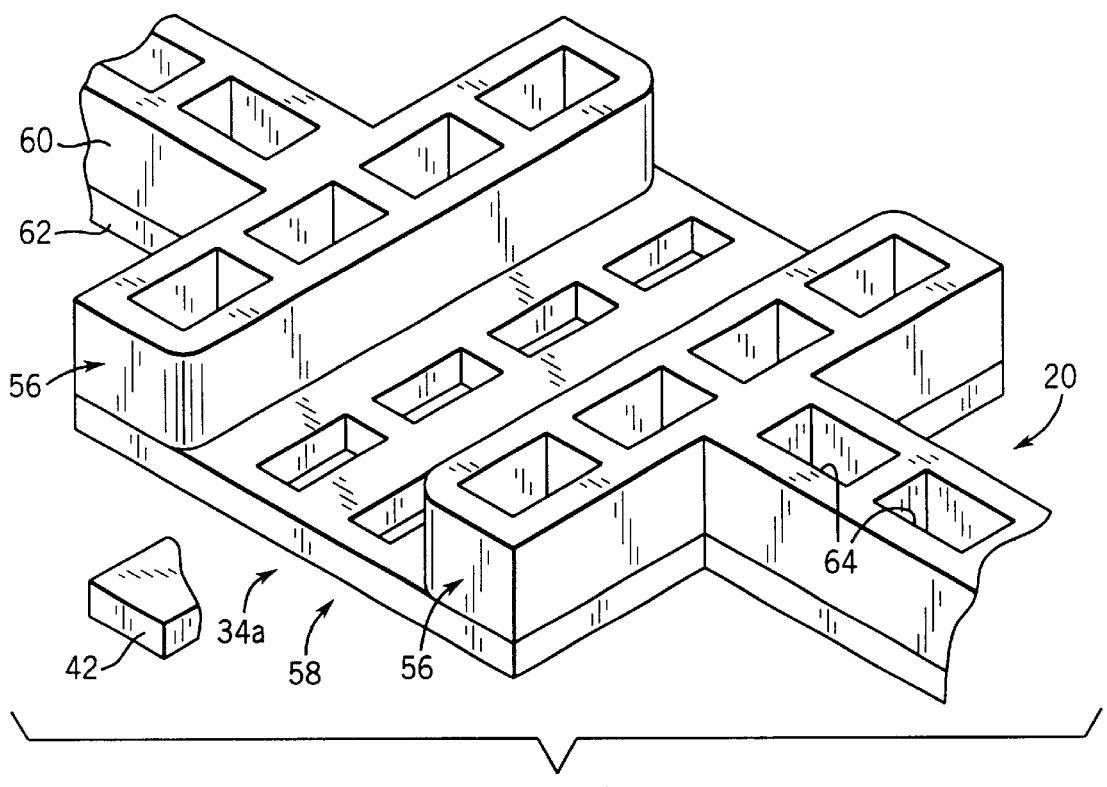
FIG. 3 is a simplified perspective view of an insulating section of the beam of FIG. 2 showing the use of laminated conductive and nonconductive layers and the removal of the conductive layer to create the insulating section.

46 Referring again to FIGS. 2 and 3, in between the flexing transverse arm pairs 46 the beam 20 expands to create T-bars 56 flanking insulating portion 34a and 34b. Insulating material 58 attached to these T-bars 56 create the insulating portions 34. Generally the beam 20 may be fabricated using well-known MEMS processing techniques to produce a structure suspended above the substrate 42 and composed of a laminated upper conductive layer 60 (for example polycrystalline silicon or crystalline silicon optionally with an upper aluminum layer) and a lower insulating layer 62 such as silicon dioxide or silicon nitride. The insulating portions 34 may be obtained simply by etching away the upper layer in the region 34a or 34b according to techniques well known in the art using selective etching techniques. An improved method of fabricating these structures is described in U.S. Pat. No. 6,159,385 issued Dec. 12, 2000 hereby incorporated by reference. The edges and corners of the T-bars 56 may be rounded to increase the breakdown voltage between them.

Each of the upper conductive layer 60 and lower insulating layer 62 are perforated by vertically extending channels 64 such as assists in conducting etchant beneath the layers 60 and 62 to remove a sacrificial layer that normally attaches layers 60 and 62 to the substrate 42 below according to techniques well known in the art.

Referring now to FIG. 2 again, portion 32a of the beam 20, such as provides a portion of the actuator 12 may have transversely outwardly extending, moving capacitor plates 66 overlapping with corresponding transversely inwardly extending stationary capacitor plates 68 attached to the pylons 44 representing terminals 22a and 22b. Each of the moving capacitor plates 66 and their corresponding stationary capacitor plates 68 may have mutually engaging fingers (as opposed to being simple parallel plate capacitors) so as to provide for a more uniform electrostatic force over a greater range of longitudinal travel of the beam 20. The thus formed electrostatic motor operates using the attraction between the capacitor plates 66 and 68 with the terminals 22b and 22a connected to a more positive voltage than that of beam 20 (connected to terminals 22c+22d), to urge the beam 20 in the actuation direction 24. For this reason, stationary capacitor plates 68 are after the moving capacitor plates 66 on both sides of the beam 20 as one travels along the actuation direction. Capacitor plates 66 and 68 are cantilevered over the substrate 42 by the same under etching used to free the beam 20 from the substrate 42.

The pylons 44 flanking portion 32c of the beam such as form pads 38a–38d likewise include moving and stationary capacitor plates 66 and 68 in two distinct pairs. As noted, this section provides the control element 14 and as such, two electrostatic motors; one (using terminals 38c and 38d) created to produce a force in the opposite direction of actuator 12 with the moving capacitor plates 66 following the stationary capacitor plates 68 as one moves in the actuation direction 24 and the other (using terminals 38a and 38b) created to produce a force in the same direction to the actuator 12 with the moving capacitor plates 66 preceding the stationary capacitor plates 68 as one moves in the actuation direction 24. These two actuators are used in combination to give the best possible control of the closed loop system.

Referring still to FIG. 2, portion 32b of the beam also supports moving capacitor plates 66 and stationary capacitor plates 68. However in this case, the capacitor plates do not serve the purpose of making an electrostatic motor but instead serve as a sensing means in which variation in the capacitance between the moving capacitor plates 66 and stationary capacitor plates 68 serves to indicate the position of the beam 20. In this regard, the order of the stationary and moving capacitor plates 66 and 68 is reversed on opposite sides of the beam 20. Thus, the moving capacitor plates 66 precede the stationary capacitor plates 68 on a first side of the beam (the upper side as depicted in FIG. 2) as one moves in the actuation direction 24 (as measured between terminal 26a and terminals 26c+26d) whereas the reverse order occurs on the lower side of the beam 20 (as measured between terminal 26b and terminals 26c+26d). Accordingly as the beam 20 moves in the actuation direction 24, the capacitance formed by the upper moving capacitor plates 66 and stationary capacitor plates 68 increases while the capacitance formed by the lower plates decreases. The point where the value of the upper capacitance crosses the value of the lower capacitance precisely defines a null point and is preferably set midway in the travel of the beam 20.

Techniques for comparing capacitance well known in the art may be used to evaluate the position of the beam 20. One circuit for providing extremely accurate measurements of these capacitances is described in co-pending application Ser. No. 09/677,037 filed Sep. 29, 2000 and hereby incorporated by reference.

Generally, the operating structure of the MEMS analog isolator 10 is constructed to be symmetric about an axis through the middle of the beam 20 along the longitudinal axis 40 such as to better compensate the thermal expansions. In addition, the operating area of the plates of the capacitors, plates 66 and 68 on both sides of the beam 20 for the actuator 12 and the control element 14, are made equal so as to be balanced. For similar reasons, the capacitors of the electrostatic motors and the control element 14 are placed between flexing transverse arm pairs 46 so as to better control slight amounts of torsion caused by uneven forces between the capacitor plates 66 and 68.

Figure 6:
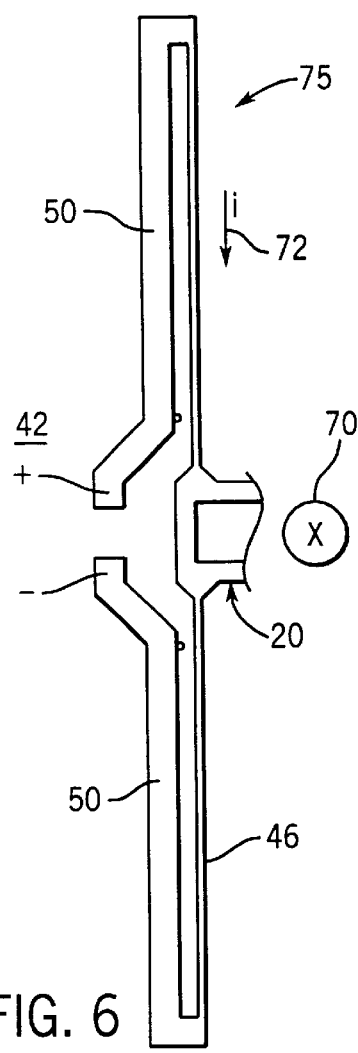
FIG. 6 is a view of one pair of transverse arms of FIG. 2 showing electrical separation of the arms of the pair to allow a current to be imposed on the arm to create a Lorenz-force motor such as may be substituted for the electrostatic motors of FIG. 2.

Referring now to FIG. 6, it will be understood that one or both of the electrostatic motors forming the actuator 12 and the control element 14 described above, may be replaced with Lorenz-force motors 75 in which forces are generated not by electrostatic attraction between capacitor plates but by the interaction of a current with a magnetic field. In the Lorenz-force motor 75, a magnetic field (e.g. with a permanent magnet, not shown) may be generated adjacent to the MEMS analog isolator 10 to produce a substrate-normal magnetic flux 70. The expansion compensators 50 supporting the flexing transverse arm 46 on opposite sides of the beam 20 are electrically isolated from each other so that a voltage may be developed across expansion compensators 50 to cause a current 72 to flow through the flexing transverse arm 46. This current flow in the magnetic field generated by the magnet will produce a longitudinal force on the beam 20 that may act in lieu of the electrostatic motors. The amount of deflection is generally determined by the flux density of the magnetic field 70, the amount of current and the flexibility of the flexing transverse arm pairs 46 in accordance with the right hand rule.

The Lorenz-force motors 75 are two quadrant, meaning they will accept currents in either direction to produce a force with or opposed to the actuation direction 24. Hence with Lorenz-force motors 75 (or the bi-directional electrostatic motor of the control element 14 described above), the MEMS analog isolator 10 may operate with two polarities unlike an optical isolator.

Figure 7:
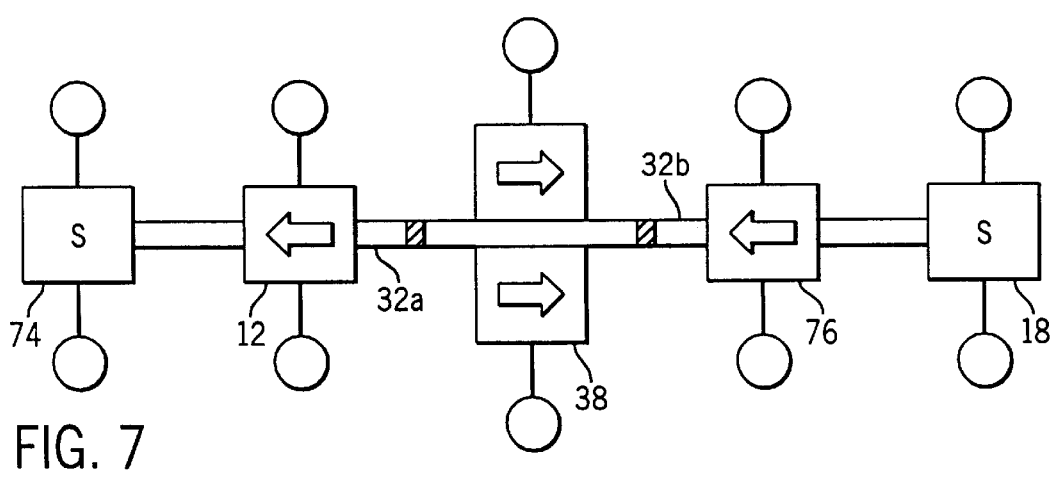
FIG. 7 is a figure similar to that of FIG. 1 showing the addition of a second sensor and second actuator on opposite ends of the beam to allow for a bi-directional isolator or with the additional sensor alone, a high reliability isolator.

Referring now to FIG. 7, the actuator 12 positioned on beam portion 32a, may be teamed with a second sensor 74 for sensing motion of the beam 20 and that sensor 74 may be used to provide isolated feedback to a device producing the analog electrical input signal 21 as to motion of the beam 20 such as may be used to ensure greater reliability in the transmission of signals.

Alternatively or in addition, the sensor 18 may be teamed with an actuator 76 having the same orientation of actuator 12 but positioned in isolation portion 32b. When actuator 76 is teamed with sensor 74, they together provide a bi-directional analog isolator in which isolated signals may be sent from either end of the beam 20 to the other end. It will be understood that another variation of this embodiment may eliminate the control element and instead the actuators 76 and 12 may be used during transmission by the other actuator as the control element. Such a device may be useful in some multi-loop analog system or for scaling adjustment.

It will be understood with greater circuit complexity that certain of the elements of the actuator 12, control element 14 and sensor 18 may be combined into individual structures and hence, these terms should be considered to cover the functional equivalents of the functions of actuator control element 14 and sensor 18 whether or not they are realized as individual structures or not. Further the relative location of the control element 14, the actuator 12 and the sensor 18 may be swapped and still provide isolated signal transmission.

Figure 8:
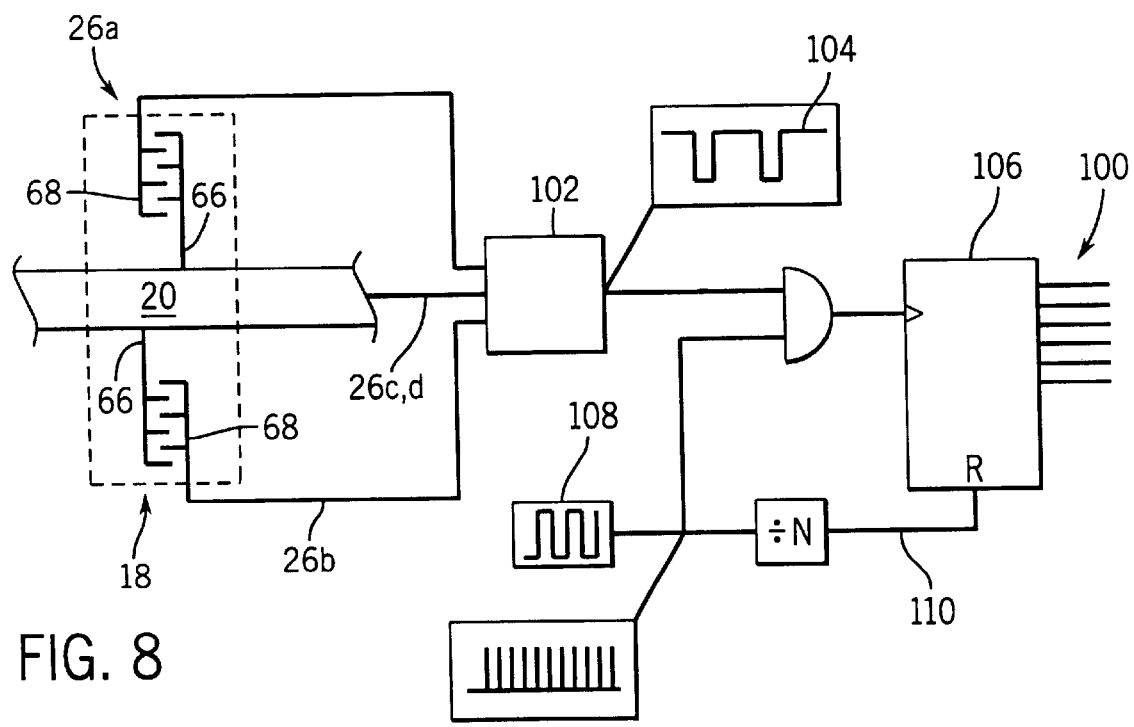
FIG. 8 is a detailed view of the sensor of FIG. 1 and its associated processing electronics for extracting a digital word from the isolator of the present invention.

Referring now to FIG. 8, a digital word output 100 can be obtained from the sensor 18 by making use of an error signal 31 resulting directly from a comparison of the capacitors of the sensor 18 by capacitive comparison circuit 102 of a type well known in the art. One such circuit for providing extremely accurate measurements of these capacitances in described in co-pending application Ser. No. 09/677,037 described above. As so configured, the error signal 31 (when connected to the control element 14) will tend to restore the beam 20 to a null position dependent on the location where the values of the capacitors of the sensor 18 change their relationship of which is greater than the other. The output of the capacitive comparison circuit 102 will generally be a duty cycle modulated square wave 104 produced as the beam 20 wanders back and forth across the null point under the influences of the actuation force and the restoring force. The beam 20 provides an inertial averaging of the error signal 31 so that its average force is proportional to the actuation force. Counter 106 measures the percentage of time that the error signal 31 is in the high state. In one embodiment, the output of the capacitive comparison circuit 102 may be logically ANDed with a high rate clock signal to cause the counter 106 to count up during the time the error signal 31 is high and not otherwise. The counter may be reset periodically by a second time interval signal 110. The value on the counter 106 just prior to the resetting will be proportional to the duty cycle of the error signal 31 and therefore to the actuation signal. The frequency of the clock signal 108 and the period of the time interval signal 110 may be selected according to the desired resolution in the digital word output 100 according to methods well known in the art.

Referring again to FIG. 2, MEMS fabrication allows that a portion of the substrate 42 may also include integrated circuits 73 having a number of solid-state devices such as may implement, for example, the capacitor sense circuitry described above. A number of the MEMS analog isolators 10 may be placed on a single integrated circuit with appropriate interconnects made for providing them with the currents required. Generally, using the MEMS analog isolator 10 of the present invention, a single integrated circuit of arbitrary complexity, such as an industrial controller, may include isolators on the same substrate 42 manufactured concurrently with each other. These MEMS analog isolators 10 may provide for either inputs to the remaining integrated circuitry in the form of a digital word or, through the use of an on-board digital to analog converter, isolated analog outputs from the integrated circuit 73.

Figure 9:
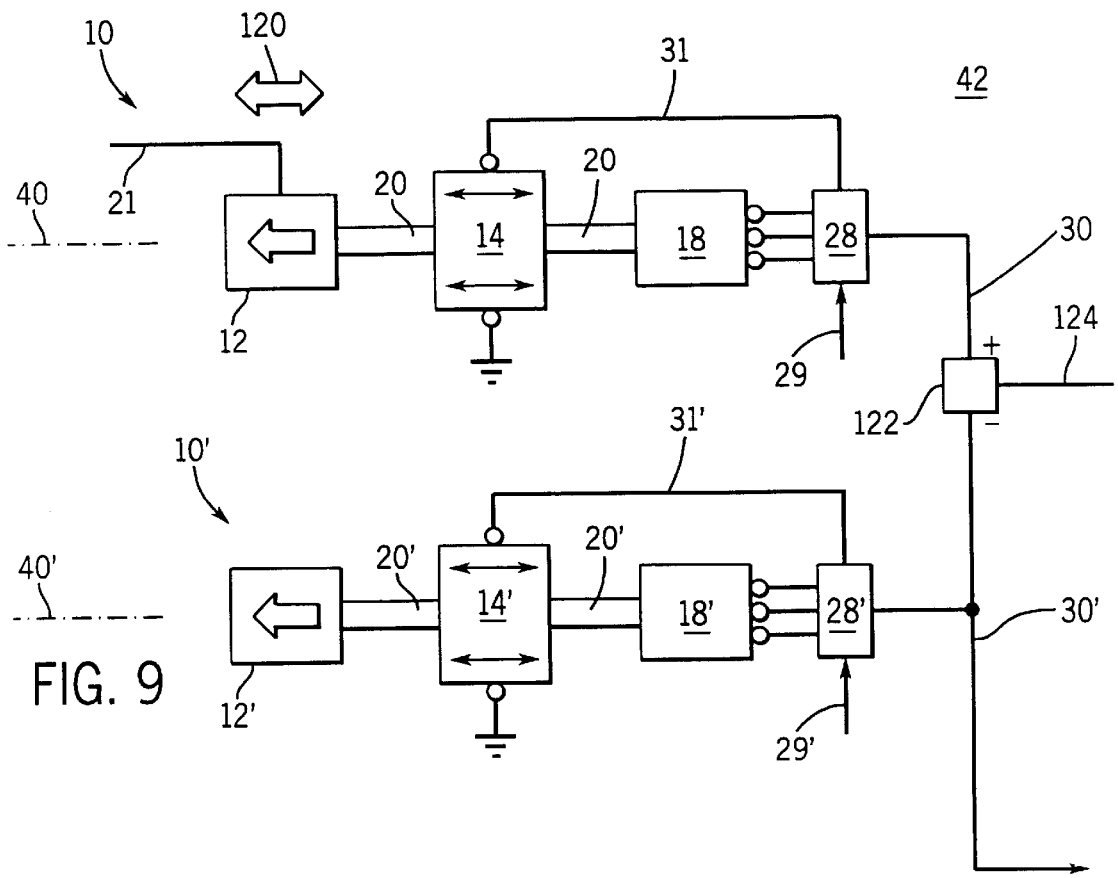
FIG. 9 is a figure similar to that of FIG. 1 showing the use of two MEMS devices for the purpose of canceling out the effects of acceleration of the substrate on measurements of the mechanical elements by subtraction of the signals from two parallel elements.

Referring now to FIG. 9, the analog isolator 10 may be fabricated adjacent to a second analog isolator 10' constructed so that an axis 40' of the second analog isolator 10' is parallel to axis 40 of the analog isolator 10 and so that the devices are in physically close proximity. In this way, acceleration of the substrate indicated by arrow 120 along axis 40 and 40' will be essentially identical for both isolators 10 and 10' even in the presence of a rotational component removed from the axes 40 and 40'. Note that the direction of the inertial force need not be along the axis of the device. In an ideal device it is only the component of the force that is along the axis that contributes to a signal. In a non-ideal device non-axial forces can also cause motion that will be detected. But, ideal or not, as long as the two devices are identical and the system is linear, the effect of inertia is the same on both devices, and so it is possible to subtract out the effect.

The analog isolator 10' is fabricated so as to be nearly identical to the analog isolator 10 having an actuator 12', a control element 14', a sensor 18', and processing electronics 28' operating in the same manner as described above with respect to analog isolator 10. The single exception to the otherwise identical construction of the analog isolator 10' is that it receives no input signal 21. Thus movement of the beam 20' of analog isolator 10' will be caused solely by acceleration of the substrate 42.

In operation, an input signal 21 representing a parameter to be measured, urges beam 20 toward a second position (e.g. the left-hand side of FIG. 9). Beam 20 will also be affected by any inertial force 120 on the substrate 42, for example, an acceleration of the substrate 42 to the left which will act to urge both beams 20 and 20' to the first position (e.g. to the right).

In the feedback configuration described above, in which the control elements act to hold the beams 20 and 20' at a null position, the output signal 30 of the analog isolator 10 will be approximately proportional to:

$$p + m_1 a$$

where p is the force on the beam 20 exerted by the measured parameter, $m_1$ is the mass of the beam 20 and the elements it carries, and a is the acceleration of the substrate 42 (where a can be either positive or negative). The value of the spring constant is not an additive effect either here in closed loop or later in open loop discussion. It is a multiplicative effect that is part of the proportionality constant which relates force to displacement to electrical signal. As long as the spring constant is a constant, it is acceptable to work with a value that is proportional to the exact value, as the relative results will still be correct In contrast, the output signal 30' of the analog isolator 10' will be approximately proportional to:

$$m_2 a$$

where $m_1 = m_2$ because of the identical construction of the analog isolators 10 and 10'.

Subtracting the output signal 30' from the output signal 30 thus provides a measure of p without the inertial noise ma.

This subtraction can be accomplished by a conventional summing junction 122 realized by an operational amplifier circuit, digital summer, or the like.

As mentioned above, the analog isolator 10 may be realized without feedback, using the control structure 14 simply to provide a spring. In this case, the output signal 30 of the analog isolator 10 will still be approximately proportional to:

$p+m_1a.$

If the displacement is large enough that the spring constant becomes non-constant (i.e. displacement is no longer a linear function of force) then the fundamental linearity of the system breaks down and the ability to cancel (subtract) the inertial force is compromised. It is an important advantage of the closed loop system that the displacements stay small and so do not violate this linearity requirement. For this reason, a system with a potentially non-linear spring function is better handled in closed loop than in open loop.

In this case, the output signal 30' of the analog isolator 10' will still be approximately proportional to:

$m_2a.$

Thus, subtracting the output signal 30' from the output signal 30 provides a measure of p without the inertial noise ma. Again, the subtraction can be accomplished by a conventional summing junction 122 realized by an operational amplifier circuit, digital summer, or the like.

Although there is no need for a functional actuator 12' for moving the beam 20' in analog isolator 10', at least those components of the actuator that are attached to the beam 20' may be included in the analog isolator 10' as to modify the mass and other physical characteristics of the beam 20', and its motion, so as to be as nearly identical to that of beam 20 as possible. Thus for example, the beam supporting the electrostatic actuators and the like may all be attached to beam 20 even though they are not connected to an input signal 21. Note that there are other concerns than just the mass that will essentially require that the entire actuator be present. For example, the small spaces between the inter-digitated fingers provides damping to the motion and so the entire finger structure must be present to duplicate the damping effects in the non-powered device. There may however, be some features that can be removed with no significant affect.

The signal 30' may be provided to other MEMS devices (not shown) sharing the substrate 42 so as to provide an inertial signal to the entire substrate that may be used to cancel out inertial noise from other isolators and other similar devices throughout the substrate.

Figure 10:
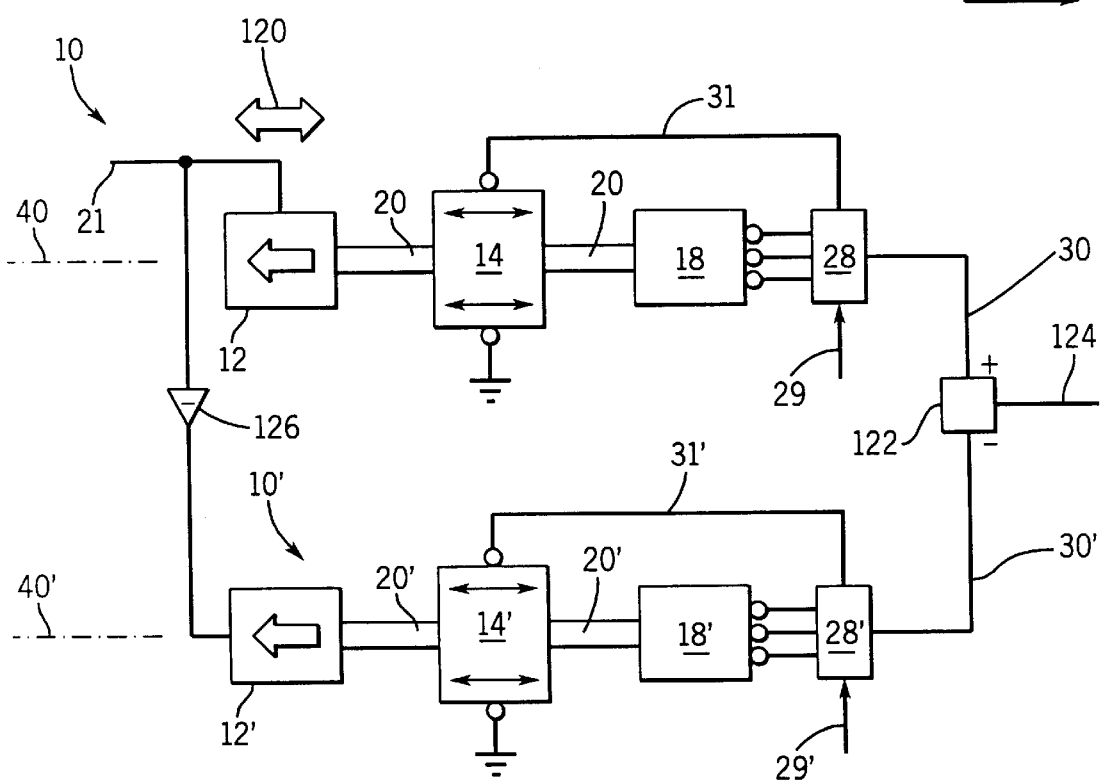
FIG. 10 is a figure similar to that of FIG. 9 showing an alternative embodiment where the two MEMS mechanical elements are driven by mutually inverted electrical signals in opposite directions so that the subtraction doubles the measured signal as well as reducing inertial noise.

Referring now to FIG. 10, an improved signal to noise ratio may be obtained by using a fully functional actuator 12' in analog isolator 10' connected to the input signal 21 through an inverter 126. The inverter, such as may be realized by an operational amplifier, effectively multiplies the signal 21 by negative one.

In this case, for a system using feedback, the signal 30 will be approximately proportional to:

$p+m_1a$ and the signal 30' will be approximately proportional to:

$-p+m_2a.$

Subtraction of signal 30' from signal 30 yields 2p providing improved signal strength, and assuming the inertial noise is not completely cancelled, as will be the case, improved signal to noise ratio. Inspection of the above description with respect to the system not using force feedback reveals that a similar output 124 is obtained of 2p in that case.

Note that in this case, if a Lorenz force motor were being used as actuators 12 and 12', input signal 21 may be directed through actuator 12' in the opposite direction to actuator 12, so as to allow the input signal 21 to operate on the beam 20' in the opposite direction of the beam 20. Or when using an electrostatic actuator structure for 12 and 12', they must be fabricated so as to act in the opposite directions to each other, with regard to the input signal 21.

In this case, the signal 30' is unique to the input signal 21 and is not shared among other MEMS devices.

Figure 11:
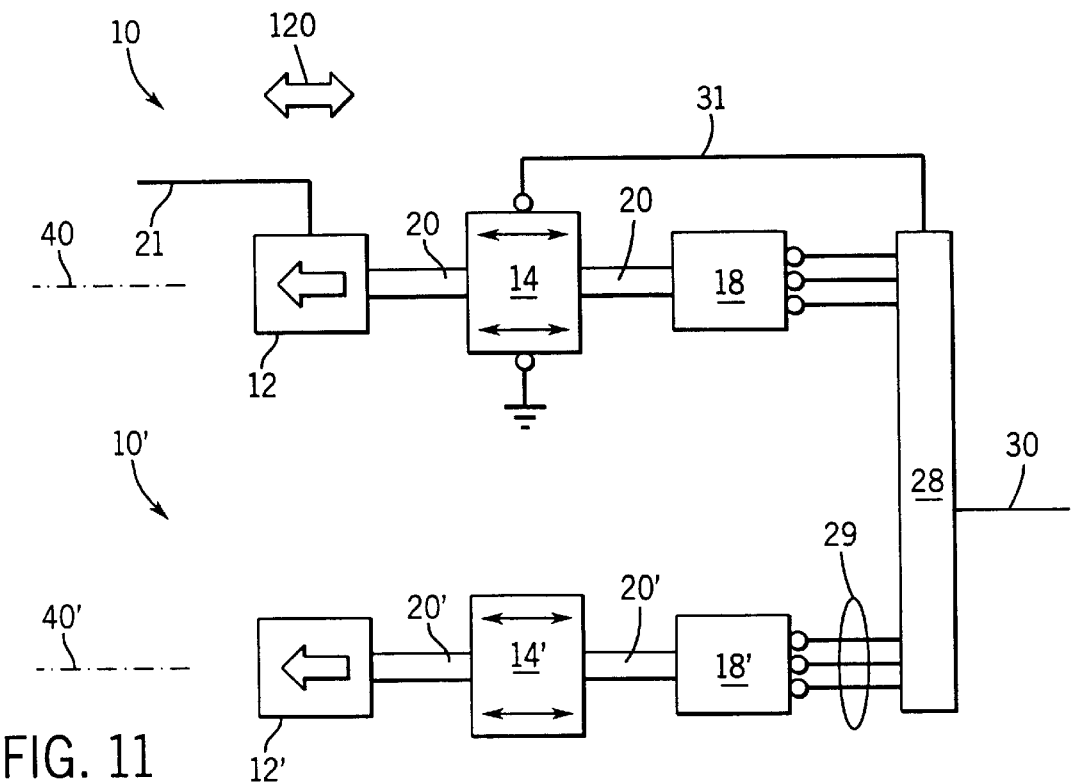
FIG. 11 is a figure similar to that of FIG. 9 wherein the ultimate subtraction of the signals from the two MEMS devices is accomplished with reduced electrical circuitry.

Referring now to FIG. 11, the system of FIG. 9 is modified such that processing electronics 28 uses the signal 18' as the reference signal. As such, the signal from 18' replaces the signal 29, shown in FIG. 9. The two devices operate similarly to the way they operate in FIG. 9, with device 10 being sensitive to both the input electrical signal and the inertial signal, while device 10' is sensitive to only the inertial signal. However, in this implementation, the subtraction of the inertial signal from the input electrical signal takes place within the processing electronics 28 and the summer 122 is not needed. The error signal 31 is still only due to the value of the input electrical signal and so is applied only to control element 14.

Figure 12:
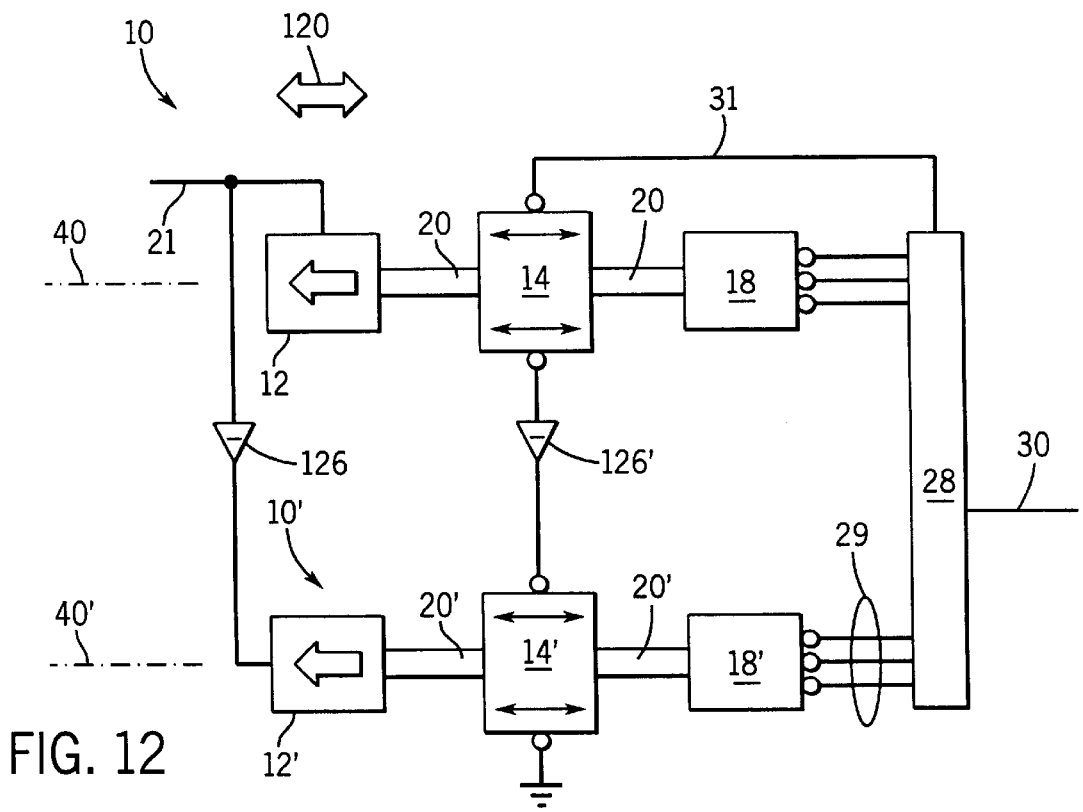
FIG. 12 is a figure similar to that of FIG. 10 wherein the ultimate subtraction of the signals from the two MEMS devices is accomplished with reduced electrical circuitry.

Referring now to FIG. 12, the system of FIG. 11 is modified such that the input electrical signal to device 10 is inverted and applied to device 10'. The subtraction of the signal from device 10 and device 10' which takes place in processing electronics 28 now results in twice the input signal. As both devices see the input electrical signal, they must also both see the error signal 31, although it must be inverted by 126' before being applied to control element 14'.

It will be recognized that this technique is not limited to the use in making analog isolators and may be used also for digital isolators in which the control elements 14 have a fixed bias or one that decreases slightly with movement of the beams 20 against the bias so as to provide a sharp threshold of movement of the beam 20 suitable for digital isolation.

Further, it will be understood that the parameter being measured need not be an electrical parameter but may be any physical parameter which may be converted to movements of a beam 20 on a microscopic level. Thus for example, the parameter may be pressure with the actuators 12 and 12' directly connected to a flexible diaphragm or the like. Further the beams 20 need not be set for linear motion but in fact may rotate about the axis 40 in which case, the first and second position would be counterclockwise or full clockwise rotation points. In this case, the inertial noise would be that of rotational acceleration.

It will be understood that the above described techniques are applicable not just to reduce the effects of inertial noise but to reduce any common mode noise including those caused by thermal expansion, pressure, mechanical distortion of the substrate and the like. It is specifically intended that the present invention not be limited to the embodiments and illustrations contained herein, but that modified forms of those embodiments including portions of the embodiments and combinations of elements of different embodiments also be included as come within the scope of the following claims.

What is claimed is:

1. A microelectromechanical system (MEMS) with reduced noise sensitivity, comprising:
   a substrate;
   a first element supported from the substrate for movement between first and second positions with respect to an axis relative to the substrate;
   a first actuator attached to the first element to exert a force thereupon dependent upon a parameter to be measured and urging the element toward the second position;
   a second element supported from the substrate for movement between the first and second positions with respect to the axis relative to the substrate; and
   a sensor assembly communicating with the first and second elements to detect movement of the first and second elements and to provide an output subtracting measurement of movement of the first and second elements so as to provide an output with reduced influence from common mode noise acting to move the first and second elements.

2. The MEMS device of claim 1 including farther a second actuator attached to the second element but not communicating with the parameter to be measured to not exert a force thereupon dependent upon the parameter to be measured.

3. The MEMS device of claim 1 including further a second actuator attached to the second element to exert a force thereupon dependant upon the parameter to be measured and urging the element toward the first position.

4. The MEMS device of claim 1 wherein the parameter is an electrical signal and wherein the first and second actuators receive input electrical signals related to the parameter and expert a force dependent on the input electrical signal.

5. The MEMS device of claim 1 further including an input circuit receiving She input electrical signal and producing a first input electrical signal for the first actuator and a second input electrical signal for the second actuator wherein the first input electrical signal is inverted with respect to the second electrical signal.

6. The MEMS device of claim 1 wherein the second element is not connected to an actuator exerting a force thereupon dependant upon the parameter to be measured and wherein the sensor assembly subtracts the sensed position of the second element from the sensed position of the first element to provide the output.

7. The MEMS device of claim 1 wherein the sensor assembly subtracts the sensed position of the second element indicating the inverted parameter plus the effects of substrate acceleration from the sensed position of the first element indicating the noninverted parameter plus effects of substrate acceleration to provide the output.

8. The MEMS device of claim 1 wherein the first and second actuators are selected from the group consisting of: an electrostatic motor, a Lorenz force motor, a piezoelectric motor, a thermal-expansion motor, and a mechanical-displacements motor.

9. The MEMS device of claim 1 wherein the sensor assembly includes sensors to detect movement of the first and second elements selected from the group consisting of capacitive sensors, piezoelectric sensors, photoelectric sensors, resistive sensors, and optical switching sensors.

10. The MEMS device of claim 1 wherein the first and second elements are beams attached to the substrate for sliding motion along an axis parallel to an adjacent surface of substrate.

11. The MEMS device of claim 1 wherein the first and second actuators are connected in opposite directions to the first and second beams.

12. The MEMS device of claim 1 wherein the sensor assembly includes capacitors attached to the first and second beams so as to provide an opposite change in capacitance for corresponding capacitors of the first and second beams.

13. The MEMS device of claim 8 wherein the beams move with respect to the substrate along a longitudinal axis and including flexing transverse arm pairs attached at longitudinally opposed ends of the beam to extend outward therefrom to support the beam with respect to the substrate.

14. The MEMS device of claim 1 further including:
   a first control element attached to the first element to exert a force dependent on the displacement of the first element toward the first position; and
   a second control element attached to the second element to exert a force dependent on the displacement of the first element toward the first position.

15. The MEMS device of claim 1 further including:
   a first control element attached to the first element to exert a predetermined substantially constant force on the first element toward the first position; and
   a second control element attached to the second element to exert a predetermined substantially constant force on the first element toward the first position.

16. The MEMS device of claim 1 wherein at least a portion of the first element between the first actuator and the sensor assembly is an electrical insulator to electrically isolate the first actuator from the sensor assembly.

* * * * *